United States Patent [19]

Anderson et al.

[11] Patent Number: 4,635,261
[45] Date of Patent: Jan. 6, 1987

[54] ON CHIP TEST SYSTEM FOR CONFIGURABLE GATE ARRAYS

[75] Inventors: Floyd E. Anderson, Round Rock, Tex.; Liang-Tsai Lin, San Diego, Calif.

[73] Assignee: Motorola, Inc., Schaumburg, Ill.

[21] Appl. No.: 748,885

[22] Filed: Jun. 26, 1985

[51] Int. Cl.$^4$ ............................................ G01R 31/28
[52] U.S. Cl. ...................................... 371/25; 371/27; 371/67; 324/73 R
[58] Field of Search ......................... 371/15, 25, 27, 67, 371/68; 324/73 R, 73 AT, 73 PC; 364/200, 900

[56] References Cited

U.S. PATENT DOCUMENTS

| | | | |
|---|---|---|---|
| 4,244,048 | 1/1981 | Tsui | 371/25 |
| 4,357,703 | 11/1982 | Van Brunt | 371/15 |
| 4,423,509 | 12/1983 | Feissel | 371/25 |
| 4,471,484 | 9/1984 | Sedmark | 371/27 |
| 4,517,672 | 5/1985 | Pfleiderer | 371/25 |
| 4,519,078 | 5/1985 | Komonytsky | 371/25 |
| 4,534,028 | 8/1985 | Trischler | 371/25 |
| 4,584,683 | 4/1986 | Shimizu | 371/25 |

OTHER PUBLICATIONS

Resnick, D. R., "Testability and Maintainability with a New 6K Gate Array", VLSI Design, Mar./Apr. 1983.

Primary Examiner—Michael R. Fleming
Attorney, Agent, or Firm—William E. Koch

[57] ABSTRACT

An on chip test system for arrays is provided that includes self test and maintenance operation while allowing for both synchronous and pipeline modes of normal operation. The system is integrated on a chip that includes a plurality of inputs and a plurality of outputs. A plurality of gates are coupled between the plurality of inputs and outputs wherein input signals may be transmitted asynchronously to the gates and output signals may be transmitted asynchronously to the outputs. An input shift register is coupled between each of the inputs and the gates for synchronously transmitting input signals, and an output shift register is coupled between the gates and each of the outputs for synchronously transmitting output signals. A control logic circuit is coupled to the plurality of gates, the input shift registers, and the output shift registers for selecting the systems mode of operation. A comparator circuit is coupled to the output shift registers for comparing said output signals with expected signals.

12 Claims, 7 Drawing Figures

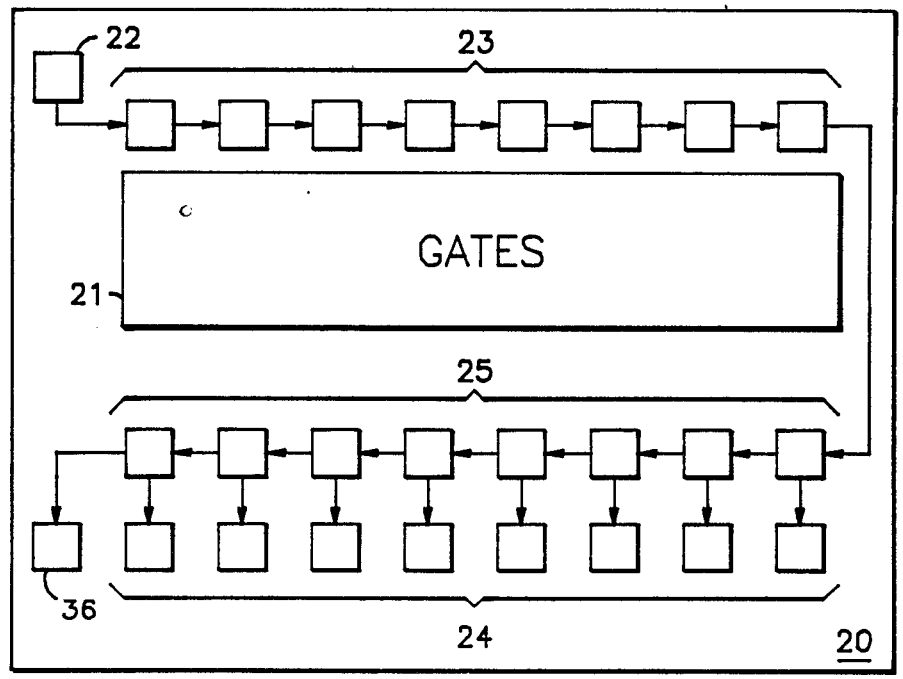
FIG. 3
FIG. 4
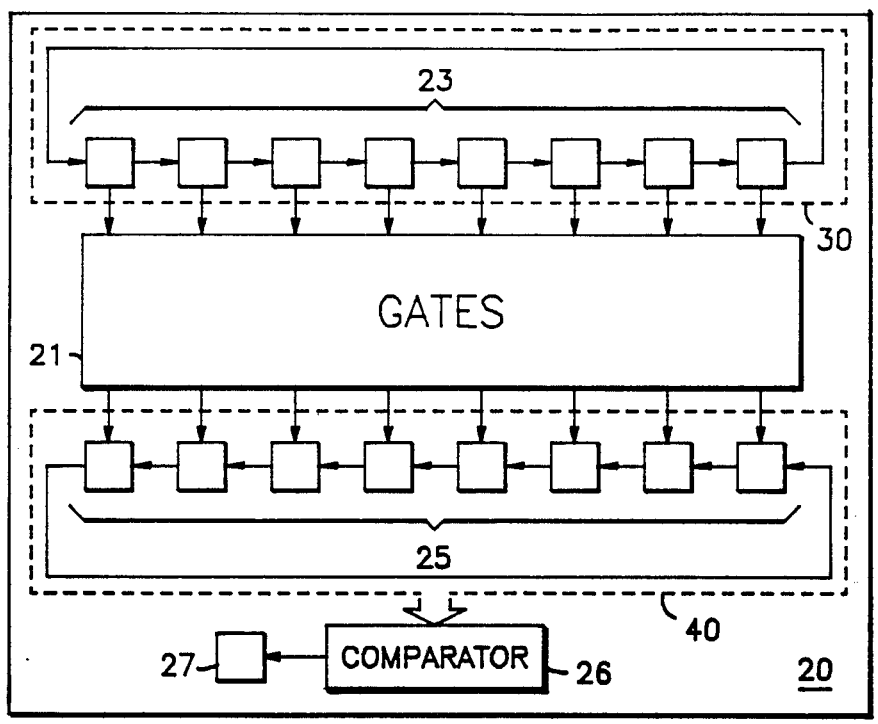

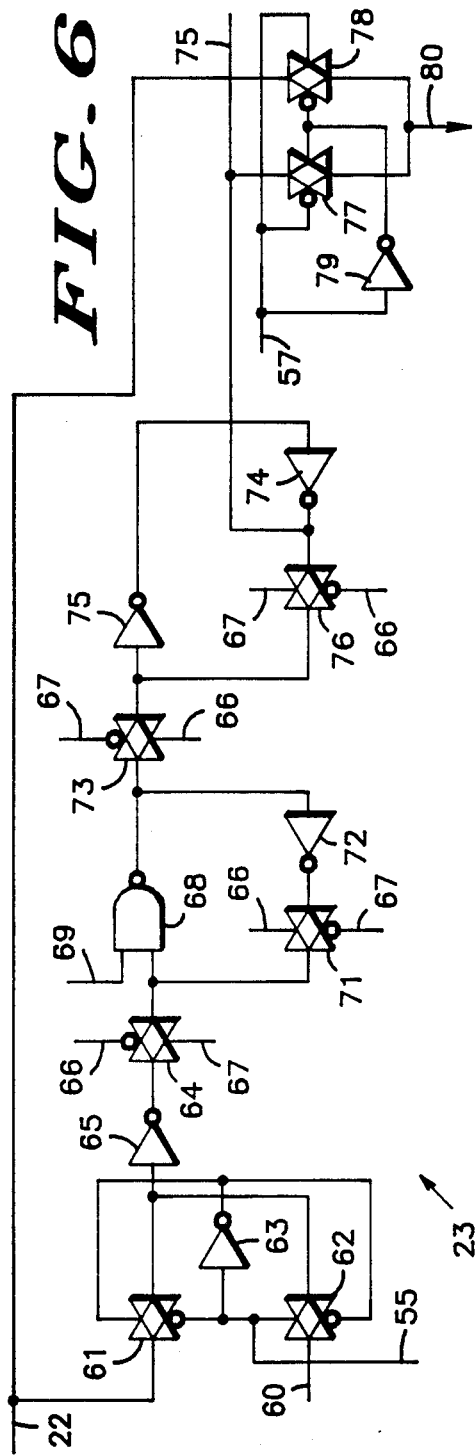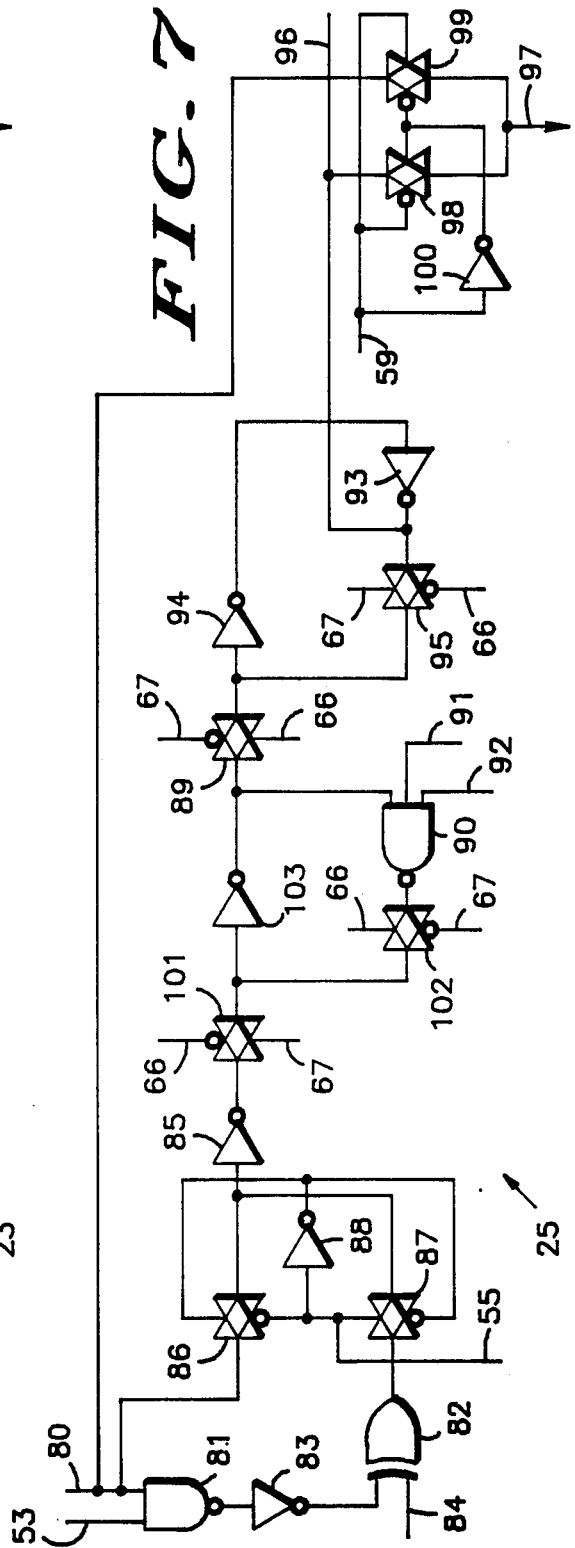

ON CHIP TEST SYSTEM FOR CONFIGURABLE GATE ARRAYS

BACKGROUND OF THE INVENTION

1. Field of the Invention

This invention relates generally to configurable gate arrays and, more particularly, to a configurable gate array having an on chip test system.

2. Background Art

Configurable gate arrays traditionally operate in either an asynchronous mode or a synchronous (pipeline) mode. In the asynchronous mode, signals are applied directly through the input pins to the gates of the array. In the pipeline mode, shift registers are coupled between each of the input pins and the gates of the array for clocking each of the signals from the input pins to the gates of the array simultaneously.

Gate arrays, and large scale integrated (LSI) circuits in general, have become so complex, that initial testing and subsequent maintenance of these circuits have become a major challenge. Earlier conventional methods applied test vectors through input pins and compared the output of the chip with an expected output. However, this method is time consuming, expensive, and presents a difficult task of determining a set of test vectors that is both valid and complete. Furthermore, connection of electrical test equipment to the chip in a test environment does not provide error free and repeatable performance. Thus, the testing of arrays requiring mechanical connection of the test equipment to the chip is not desirable.

One more recent known method comprises an on chip test system having internal storage elements designed so that they may operate as shift registers for self testing and diagnostic functions. Sequential logic elements are provided so that test and diagnostic operations are not dependent upon signal transition times or transmission delays, thus allowing for the transformation of sequential logic to combinational logic for testing. However, independent shift registers are not provided for the self test functions.

Another known method that provides for the maintenance function comprises an enhanced "Set-Scan Loop" known as the Maintenance Node Network. This method connects all internal chip registers into a single-bit stream. Each chip, or node, is able to communicate with one node up-stream and two nodes down-stream. Thus, all chips on a board, or in a system, form a binary tree and are able to receive test vectors from, and send test results back to, a maintenance processor. The registers on a chip exist at the input/output as well as internal to the logic. The Maintenance node network then, is a finite-state machine which operates synchronously with the chip clock.

U.S. Pat. No. 4,357,703 describes a test system for testing of LSI chips at full system clock rates that is resident on the chip under test. The system includes switchable transmission gates to alter logic paths, a control shift register in the test function, an input shift register, an associated test generator and accumulator, an output shift register and an associated generator and accumulator. Test vectors are produced using a shift register connected to all inputs of the logic function under test. Checksum logic, together with a shift register, produce a running checksum of all output states of the module under test at the operative clock rate of the chip.

However, none of the above methods disclose an on chip test system that includes self test and maintenance operation while allowing for both synchronous and pipeline modes of normal operation.

Thus, an on chip system for configurable gate arrays is needed that includes self test and maintenance modes while allowing for both synchronous and pipeline modes of normal operation.

SUMMARY OF THE INVENTION

Accordingly, it is an object of the present invention to provide an improved on chip test system.

Another object of the present invention to provide an on chip test system for arrays that includes self test and maintenance operation while allowing for both synchronous and pipeline modes of normal operation.

In carrying out the above and other objects of the invention in one form, there is provided an on chip test system for arrays that includes self test and maintenance operation while allowing for both synchronous and pipeline modes of normal operation. The system is integrated on a chip that includes a plurality of inputs and a plurality of outputs. A plurality of gates are coupled between the plurality of inputs and outputs wherein input signals may be transmitted asynchronously to the gates and output signals may be transmitted asynchronously to the outputs. An input shift register is coupled between each of the inputs and the gates for synchronously transmitting input signals, and an output shift register is coupled between the gates and each of the outputs for synchronously transmitting output signals. A control logic circuit is coupled to the plurality of gates, the input shift registers, and the output shift registers for selecting the systems mode of operation. A comparator circuit is coupled to the output shift registers for comparing said output signals with expected signals.

The above and other objects, features, and advantages of the present invention will be better understood from the following detailed description taken in conjunction with the accompanying drawings.

BRIEF DESCRIPTION OF THE DRAWINGS

FIG. 3 is a block diagram of the preferred embodiment configured for operation in the self test shift register mode.

FIG. 4 is a block diagram of the preferred embodiment configured for operation in the self test mode.

FIG. 6 is a block diagram of an input shift register.

FIG. 7 is a block diagram of an output shift register.

DETAILED DESCRIPTION OF THE INVENTION

Figure 1:
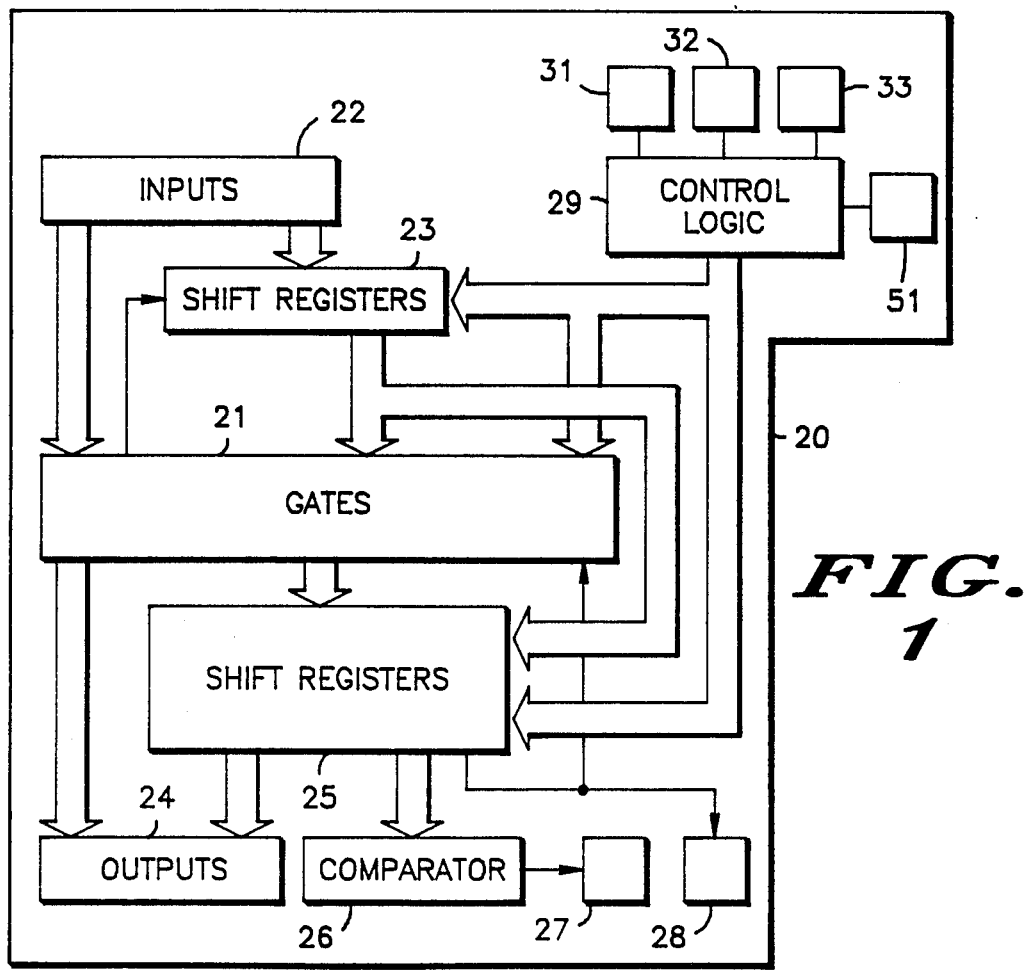
FIG. 1 is a block diagram of a gate array illustrating the preferred embodiment.

Referring to FIG. 1, a gate array in accordance with the present invention is shown which is suitable to be fabricated in monolithic integrated circuit form. Chip 20 includes a plurality of gates 21 that may number as many as many thousands for some arrays. Inputs 22 typically are alligned along one or two sides of chip 20, and are both connected directly to gates 21 and coupled to gates 21 by shift registers 23. Outputs 24 typically are alligned along another one or two sides of chip 21, and are both connected directly to gates 21 and coupled to gates 21 by shift registers 25. Each input 22 and output 24 comprises a pad for coupling to receive or transmit, respectively, an external signal. Each input 22 and output 24 may further comprise one or more devices, such as an emitter follower transistor, for improving the external signal. The number of inputs 22 and outputs 24 may number as many as fifty or more each for some arrays. Furthermore, in some instances, one or more inputs 22 or outputs 24 may serve as both an input and output (which would require two registers, one input and one output).

Shift registers 23 are further connected to shift registers 25 and shift registers 25 are further connected to comparator 26. Comparator 26 is connected to pass/fail pad 27. Shift registers 25 are coupled to pad 28 and to gates 21.

Control logic 29 is coupled between control signal inputs 31, 32 and 33 and shift registers 23 and 25, and to gates 21, and controls the operation of the array according to the state of the digital signals applied to control signal inputs 31, 32, and 33.

For normal asynchronous operation, input signals are applied through one or more inputs 22 directly to gates 21. The logical output of gates 21 is provided directly to outputs 24.

For normal synchronous, or pipeline, operation, input signals are applied through one or more inputs 22 to shift registers 23. The input signals are then transmitted to gates 21 simultaneously on a clock pulse in a manner well known to those skilled in the art. The logical output of gates 21 is provided to shift registers 25 and sent to outputs 24 on the next clock pulse.

Figure 2:
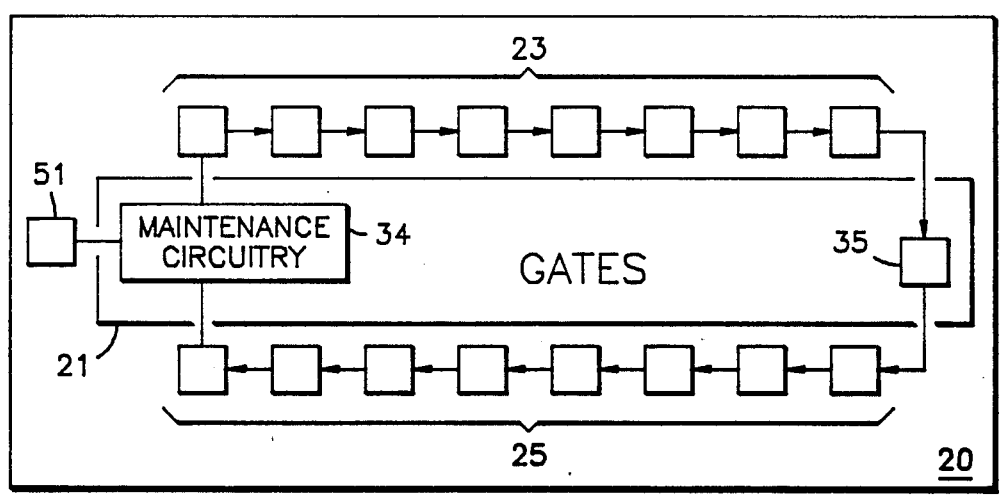
FIG. 2 is a block diagram of the preferred embodiment configured for operation in the normal set scan mode.

Referring to FIG. 2, a partial block diagram illustrates the normal set scan mode of operation. For ease of illustration, only eight of shift registers 23 and 25 are shown. Gates 21 includes maintenance circuitry 34 having an output connected to the input of one shift register 23. Each of the remaining shift registers 23 are coupled in series, i.e., the output of the first is coupled to the input of the next, and so on. The output of the last shift register 23 in series is coupled to additional shift registers 35 within gates 21. The output of shift registers 35 is coupled to the input to one of shift registers 25. Each of the remaining shift registers 25 are coupled in series similar to shift registers 23. The output of the last shift register 25 in series is coupled to maintenance circuitry 34.

For maintenance node set scan operation, the control signals applied to inputs 31, 32 and 33 are the same as that for normal asynchronous operation. This is possible because internal shift registers 23 and 25 may clock data through serially which is transparent to data appearing at the input and output pads. Control signal 51 allows the maintenance node processor to interupt the gate array during asynchronous operation without changing the "000" status of control signals 31, 32 and 33.

Referring to FIG. 3, a partial block diagram illustrates the self test shift register mode of operation. An input signal is applied through one input of inputs 22 to the input of one of shift registers 23. Shift registers 23 are coupled in series with the output of the last shift register 23 in series coupled to the input of one of shift registers 25. Shift registers 25 are coupled in series with the output of the last shift register 25 in series coupled to pad 36. The output of each of shift registers 25 is coupled to its respective output 24.

In the shift register-mode, a serial string of test vectors is applied through input 22 to the first shift register 23 and to each additional shift register 23 and 25 with each clock pulse.

This configuration provides three specific functions. First, the logic levels at output pads 24 are controlled by the data shifted into registers 25. This in turn, allows the levels on the printed circuit board runs to be controlled and tested (e.g., when chip 20 is one of many on a printed circuit board). Second, serial data may be shifted through the gate array onto another chip on the board, i.e., provide a data path. Third, the data shifted through shift registers 23 and 25 may be used to provide a test of the operation of the self test circuits.

Referring to FIG. 4, a partial block diagram illustrates the self test mode of operation. Shift registers 23 are coupled in series and the output of the last shift register 23 in series is coupled back as feedback to the input of the first so that shift registers 23 function as a pseudo random pattern generator 30. Additionally, the output of each shift register 23 is coupled to gates 21. Shift registers 25 are coupled in series and the output of the last shift register 25 in series is coupled back as feedback to the input of the ninth to the last so that shift registers 25 function as a signature analysis register 40. Additionally, the outputs of gates 21 are coupled into each shift register 25. The output of the last nine shift registers in series are coupled to comparator 26 for comparing to an expected result (signature).

Comparator 26 is a nine bit comparator which is metal programmable (i.e. programmed by the metal mask layer). By running a logic simulation of the design on gates 21 under self test conditions, the values contained in the last nine stages of shift register 25 can be determined. These bits in the last nine stages at the end of self test will now represent the signature of a good device. It is this signature that is programmed into the comparator (each design will have a unique signature). When self test is actually run on gates 21, the bits contained in the last nine stages of shift register 25 at the end of the test will be its signature. This signature is then compared to the one programmed into the comparator. Comparator 26 then provides a digital pass/fail signal to output 27.

Figure 5:
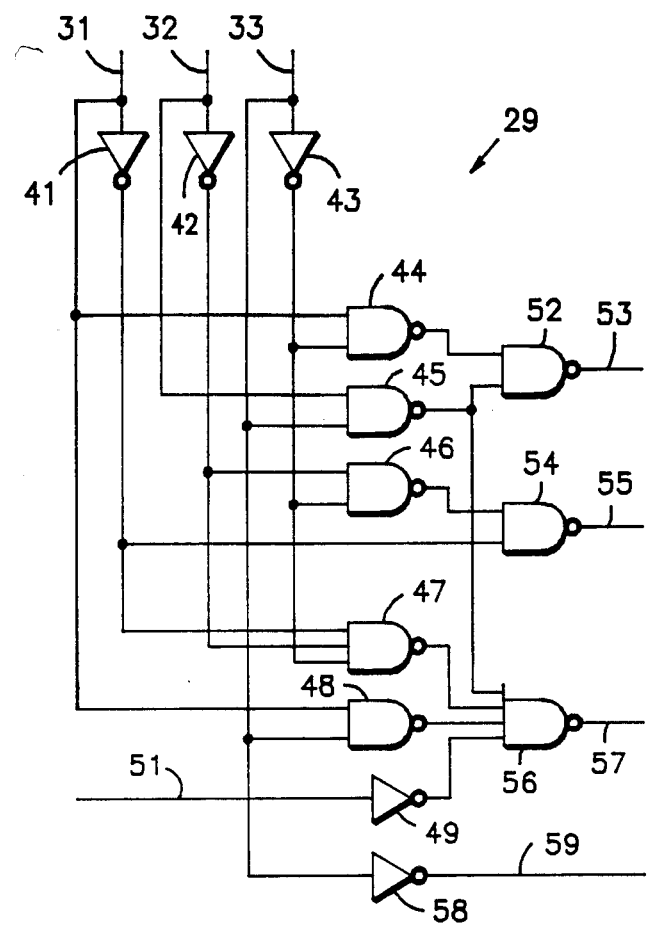
FIG. 5 is a block diagram of the control logic.

Referring to FIG. 5, logic circuitry 29 comprises inverters 41, 42 and 43 having their input coupled to control inputs 31, 32 and 33. NAND gate 44 has a first and a second input connected to control input 31 and the output of inverter 43, respectively. NAND gate 45 has a first and a second input connected to control input 32 and control input 33, respectively. NAND gate 46 has a first and a second input connected to the output of inverter 42 and inverter 43, respectively. NAND gate 45 has a first and a second input connected to control input 32 and control input 33, respectively. NAND gate 46 has a first and a second input connected to the output of inverter 42 and inverter 43, respectively. NAND gate 47 has a first, second and third input connected to the output of inverter 42 and inverter 43, respectively. NAND gate 47 has a first, second and third input connected to the outputs of inverters 41, 42 and 43, respectively. NAND gate 48 has a first and second input connected to control input 31 and 33, respectively. Inverter 49 has its input coupled to receive a maintenance node control signal (MCI) 51. NAND gate 52 has a first and second input connected to the output of NAND gates 44 and 45, respectively, for providing a first control output 53. NAND gate 54 has a first and second input connected to the output of NAND gate 46 and the output of inverter 41, respectively, for providing a second control output 55. NAND gate 56 has a first, second, third and fourth input connected the output of NAND gate 45, NAND gate 47, NAND gate 48 and inverter 49, respectively, for providing control output 57. Inverter 58 has its input connected to control input 43 for providing a fourth control output 59.

In operation, control signals 31, 32, 33 and 51 determine the state of the first through fourth control output signals 53, 55, 57 and 59 according to the truth table as follows:

| CONTROL INPUT SIGNALS | | | | CONTROL OUTPUT SIGNALS | | | |
|---|---|---|---|---|---|---|---|
| 31 | 32 | 33 | 51 | 53 | 55 | 57 | 59 |
| 0 | 0 | 0 | 0 | 0 | 1 | 1 | 1 |
| 0 | 0 | 0 | 1 | 0 | 1 | 1 | 1 |
| 0 | 0 | 1 | 0 | 0 | 0 | 0 | 0 |
| 0 | 0 | 1 | 1 | 0 | 0 | 1 | 0 |
| 0 | 1 | 0 | 0 | 0 | 0 | 0 | 1 |
| 0 | 1 | 0 | 1 | 0 | 0 | 1 | 1 |
| 0 | 1 | 1 | 0 | 1 | 0 | 1 | 0 |
| 0 | 1 | 1 | 1 | 1 | 0 | 1 | 0 |
| 1 | 0 | 0 | 0 | 1 | 1 | 0 | 1 |
| 1 | 0 | 0 | 1 | 1 | 1 | 1 | 1 |
| 1 | 0 | 1 | 0 | 0 | 1 | 1 | 0 |
| 1 | 0 | 1 | 1 | 0 | 1 | 1 | 0 |
| 1 | 1 | 0 | 0 | 1 | 1 | 0 | 1 |
| 1 | 1 | 0 | 1 | 1 | 1 | 1 | 1 |
| 1 | 1 | 1 | 0 | 1 | 1 | 1 | 0 |
| 1 | 1 | 1 | 1 | 1 | 1 | 1 | 0 |

Control signal 51 is specifically for use during maintenance node operation under control of the maintenance processor and is normally a logical low. When signal 51 does go "high", control signal 57 is forced "low", which in turn allows input signals 22 of FIG. 7 to pass through transmission gate 78 to signal 80. This will happen regardless of any inputs on control signals 31, 32, and 33. Control signals 31, 32, and 33 may be considered to be "mode select" signals which are decoded by control logic 29 to provide internal control signals 53, 55, 57, and 59. These internal control signals are routed to input shift registers 23, output shift registers 25, and gates 21 to determine the path data will take as well as the function of the registers. The particular mode selected is as follows:

| CONTROL SIGNALS | 31 | 32 | 33 | 51 | MODE |
|---|---|---|---|---|---|
| | 0 | 0 | 0 | 0 | Asynchronous |
| | 0 | 0 | 1 | 0 | Pipeline |
| | 0 | 1 | 0 | 0 | Synchronous input |
| | 0 | 1 | 1 | 0 | Synchronous output |
| | 1 | 0 | 0 | 0 | Self Test |
| | 1 | 0 | 1 | 0 | Serial Data |
| | 0 | 0 | 0 | 1 | Maintenance Node |

Referring to FIG. 6, shift register 23 includes transmission gate 61 having an input coupled to its respective input 22 and transmission gate 62 having an input coupled to the output 60 of the preceding shift register 23 in series. Transmission gates 61 and 62 have one enable input connected to second control output 55 and another enable input coupled to second control output 55 by inverter 63. Transmission gate 64 has its input coupled to the output of transmission gates 61 and 62 by inverter 65. NAND gate 68 has a first input coupled to SET signal 69 and a second input coupled to the output of transmission gates 64 and 71. Transmission gate 71 has its input coupled to the output of NAND gate 68 by inverter 72. Transmission gate 73 has its input connected to the output of NAND gate 68. Inverter 74 has its input coupled to the output of transmission gate 73 by inverter 75. Inverter 75 further has its input coupled to the output of inverter 74 by transmission gate 76. Transmission gates 64, 71, 73 and 76 have one enable input connected to clock signal 66 and another enable input coupled to clock bar signal 76. The output of inverter 74 is provided as output of shift register 22 at terminal 75 to the next shift register 22 coupled in series and is provided as output at terminal 80 to gates 21 by coupling through transmission gate 77. Output 80 is also coupled to input 22 by transmission gate 78. Transmission gates 77 and 78 has one enable input coupled to third control output 57 and another enable input coupled to third control output 57 by inverter 79.

In operation, when second control output 55 is a logical low, input 22 is passed to transmission gate 64. When signal 69 is a logical low, a logical high is passed to gate 73 and the flip-flop is set, or when signal 69 is a logical high, input 22 is passed to transmission gate 73. Signal 22 is thereby provided as output 75 and to transmission gate 77. Input 22 is provided at output 76 when third control output 57 is a logical high, thereby triggering transmission gate 78 and disabling transmission gate 77. When third control output 57 is a logical low, transmission gate 77 is enabled and transmission gate 78 is disabled and the output of shift register 23 is provided at output 80. When third control output 57 is a logical high, transmission gate 78 is enabled and transmission gate 77 is disabled and input 22 is provided through transmission gate 78 to output 80.

Referring to FIG. 7, shift register 25 includes NAND gate 81 having a first and a second input coupled to first control output 53 and to output 80 from gates 21, respectively. Exclusive OR gate 82 has a first input coupled to the output of NAND gate 81 by inverter 83, and a second input coupled to output 84 of the previous shift register in series. The input to inverter 85 is coupled to output 80 by transmission gate 86 and to the output of exclusive OR gate 82 by transmission gate 87. A first enable input of transmission gates 86 and 87 is connected to second control output 55 and a second enable input is coupled to second control output 55 by inverter 88. The output of inverter 85 is coupled to both inverter 103 and transmission gate 102 by transmission gate 88. Inverter 86 has its output connected to transmission gate 89 and a first input of NAND gate 90. NAND gate 90 has a second and third input connected to data reset signal 91 and reset signal 92, respectively. The output of NAND gate 90 is connected to transmission gate 87. Inverter 93 has its input coupled to the output of transmission gate 89 by inverter 94. Inverter 94 further has its input coupled to the output of inverter 93 by transmission gate 95. Transmission gate 88, 87, 89 and 95 have one enable input connected to clock signal 66 and another enable input coupled to clock bar signal 67. The output of inverter 93 is provided as output of shift register 25 at terminal 96 to the next shift register 25 coupled in series and is provided as output at terminal 97 to outputs 24 by coupling through transmission gate 98. Output 97 is also coupled to input 80 by transmission gate 99. Transmission gates 98 and 99 has one enable input coupled to fourth control output 59 and another enable input coupled to fourth control output 59 by inverter 100.

In operation, when second control output 55 is a logical low, input 80 is passed to transmission gate 88 and the logical level of control signal 53 is ignored. When control signal 55 is a logical high, the output of exclusive-or 82 is made available to transmission gate 88. This signal is then available to inverter 86 on the next logical high clock edge. The output of exclusive-or 82 is controlled by control signal 53. If control signal 53 is a logical low, then the output of inverter 83 will always be a logical low regardless of the level of signal 80 and thus signal 80 is ignored. As a result signal 84 is effectively passed through exclusive-or 82 unchanged. This in effect clocks the data from one register to the next register while ignoring the data at the input pads. If control signal 53 is a logical high, then signal 80 will always be available at one input of exclusive-or 82. The result is signal 80 and signal 84 will be exclusive-ored before becoming available to transmission gate 88. The effect is that signals 80 and 84 are half added as required for signature analysis.

Signal 80 is thereby provided as output 96 and to transmission gate 98 when signals 91 and 92 are logical high and control signal 53 is a logical low. Input 80 is provided at output 97 when fourth control output 59 is a logical high, thereby triggering transmission gate 99 and disabling transmission gate 98. When fourth control output 59 is a logical low, transmission gate 98 is enabled and transmission gate 99 is disabled and the output of shift register 25 is provided at output 97.

By now it should be appreciated that there has been provided an improved on chip test system that includes self test and maintenance operation while allowing for both synchronous and pipeline modes of normal operation.

We claim:

1. An integrated circuit including a system for testing a plurality of gates forming a logic circuit on said integrated circuit, said system selectively operating in one of a plurality of modes, said integrated circuit having a plurality of inputs, each of said inputs for coupling to receive one of a plurality of input signals, and a plurality of outputs, each of said outputs for coupling to provide one of a plurality of output signal, said gates coupled between said plurality of inputs and said plurality of outputs wherein both said input signals are transmitted asynchronously from said inputs to said logic circuit and said output signals are transmitted asynchronously from said logic circuit to said output when said system is in a first of said plurality of modes, said system comprising:

first shift register means coupled between said plurality of inputs and said logic circuit for synchronously transmitting said input signals from said inputs through said first shift register means to said logic circuit when said system is in a second of said plurality of modes;

second shift register means coupled between said logic circuit and said plurality of outputs for synchronously transmitting said output signal from said logic circuit through said second shift register means for said outputs when said system is in said second mode and coupled to said first shift register means for serially transmitting said input signals from said inputs through said first shift register means and said second shift register means, respectively, to said outputs when said system is in a third of said plurality of modes; and control logic means coupled to said logic circuit, said first shift register means and said second shift register means and coupled to a control signal input for selecting said one of said plurality of modes.

2. The system according to claim 1 wherein said logic circuit comprises:

maintenance circuit means coupled to a maintenance input for receiving a maintenance signal and coupled between said second shift register means and said first shift register means for serially transmitting said maintenance signal from said maintenance circuit means to said first shift register means when said system is in a fourth mode; and third shift register means coupled between said first shift register means and said shift register means for serially transmitting said maintenance signal from said first shift register means through said third shift register means, said second shift register means and said maintenance circuit for producing a maintenance output when said system is in said fourth mode.

3. The system according to claim 1 wherein said first shift register means comprises first feedback means wherein said first shift register means functions as a pseudo random generator is a fifth mode for serially transmitting said input signals from said inputs through said first shift register means to said second shift register means, and said second shift register means comprises second feedback means wherein said second shift register means functions as a signature analysis register in said fifth mode for synchronously transmitting said input signals from said second shift register means to said outputs, said system further comprising comparator means coupled to said second shift register means for comparing said input signals with a predetermined plurality of signals and providing a signal representative of said comparison.

4. The system according to claim 1 further comprising comparator means coupled to said second shift register means for comparing a plurality of said output signals with a predetermined plurality of signals and providing a signal representative of said comparison when said system is in said third mode.

5. The system according to claim 1 wherein said input signals, in a sixth mode, are transmitted synchronously from said inputs through said first shift register means to said logic circuit and said output signals are transmitted asynchronously from said logic circuit to said outputs.

6. The system according to claim 1 wherein said input signals, in a seventh mode, are transmitted asynchronously from said inputs to said logic circuit and said output signals are transmitted synchronously from said logic circuit through said second shift register means to said outputs.

7. A monolithically integrated gate array having a test system, said gate array including a plurality of gates coupled between a plurality of inputs and a plurality of outputs, said test system comprising:

first means coupled to said plurality of gates and coupled for receiving at least one control input signal, for selecting one of a plurality of modes, wherein a first of said plurality of modes defines a plurality of data input signals being asynchronously transmitted from said plurality of inputs to said plurality of gates and a plurality of data output signals being asynchronously transmitted from said plurality of gates to said plurality of outputs; and second means coupled between said plurality of input and said plurality of gates for synchronously transmitting said data input signals from said inputs through said second means to said plurality of gates in a second of said plurality of modes and coupled between said plurality of gates and said plurality of outputs for synchronously transmitting said data output signals from said plurality of gates thorugh said second means to said outputs in said second of said plurality of modes, wherein said data input signals are serially transmitted from said plurality of inputs through said second means to said plurality of outputs in a third of said plurality of modes.

8. The monolithically integrated gate array according to claim 7 wherein said second means comprises:

third means coupled between said plurality of input and said plurality of gates, said third means including feedback for functioning as a pseudo random generator in a fourth of said plurality of modes for serially transmitting said input signals from said inputs through said second means; and fourth means coupled between said plurality of gates and said plurality of outputs, said fourth means including feedback for functioning as a signature analysis register in said fourth mode for serially transmitting said output signals from said second means to said outputs, said system further comprising comparator means coupled to said fourth means for comparing said output signals with a predetermined plurality of signals and providing a signal representative of said comparison.

9. The monolithically integrated gate array according to claim 7 wherein said plurality of gates comprises:

fifth means coupled to a maintenance input for receiving a maintenance signal and coupled between said third means and fourth means for serially transmitting said maintenance signal to said third means; and sixth means coupled between said third means and said fourth means for serially transmitting said maintenance signal from said third means through said sixth means and said fourth means to said fifth means for providing a maintenance output signal.

10. The system according to claim 7 further comprising comparator means coupled to said second means for comparing said data output signals with a predetermined plurality of signals and providing a signal representative of said comparison when said system is in said third mode.

11. The system according to claim 7 wherein said input signals, in a sixth mode, are transmitted synchronously from said inputs through said second means to said plurality of gates and said output signals are transmitted asyncronously from said plurality of gates to said outputs.

12. The system according to claim 7 wherein said input signals, in a seventh mode, are transmitted asynchronously from said inputs to said plurality of gates and said output signals are transmitted syncronously from said plurality of gates through said second means to said outputs.

* * * * *